(12) United States Patent
Sekigawa et al.

(10) Patent No.: US 7,442,477 B2
(45) Date of Patent: Oct. 28, 2008

(54) EXPOSING APPARATUS AND EXPOSING METHOD, FOR MASKLESS EXPOSURE OF SUBSTRATE TO BE EXPOSED, AND PLOTTER AND PLOTTING METHOD FOR DIRECTLY PLOTTING ON OBJECT TO BE PLOTTED

(75) Inventors: Kazunari Sekigawa, Nagano (JP);
Masatoshi Akagawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 735 days.

(21) Appl. No.: 10/809,372

(22) Filed: Mar. 26, 2004

(65) Prior Publication Data
US 2004/0197683 A1    Oct. 7, 2004

(30) Foreign Application Priority Data
Apr. 3, 2003   (JP) .............................. 2003-100377

(51) Int. Cl.
*G03C 5/00* (2006.01)
*G03F 9/00* (2006.01)

(52) U.S. Cl. ............................ 430/30; 430/22; 430/394; 430/396; 430/397

(58) Field of Classification Search .................... 430/22, 430/30, 394, 396, 397
See application file for complete search history.

(56) References Cited

U.S. PATENT DOCUMENTS 7,094,506 B2 *   8/2006   Van Buel ....................... 430/5

FOREIGN PATENT DOCUMENTS

| JP | 10-112579 | 4/1998 |
|---|---|---|
| JP | 2001-174721 | 6/2001 |

* cited by examiner

*Primary Examiner*—Christopher G Young
(74) *Attorney, Agent, or Firm*—Staas & Halsey LLP (57) ABSTRACT

An exposing apparatus for irradiating desired spots on a substrate to be exposed relatively moving with respect to two or more light sources arranged along the direction of the relative movement to form a desired exposure pattern using the light sources comprises a control means for controlling the turning-on of only specific light sources out of the two or more light sources at a specific timing.

9 Claims, 4 Drawing Sheets

SIMULATION RESULT

| IDENTIFICATION NUMBER i OF LIGHT SOURCE | FRAME f | RESOLUTION CANDIDATE r |
|---|---|---|
| 2 | 242 | 0.5489424 |
| 5 | 969 | 0.5438729 |
| 8 | 1696 | 0.5388034 |
| 11 | 2423 | 0.5337338 |
| 14 | 3150 | 0.5286643 |
| 17 | 3877 | 0.5235948 |
| 20 | 4604 | 0.5185253 |
| 23 | 5331 | 0.5134557 |

Fig.5

EXPOSING APPARATUS AND EXPOSING METHOD, FOR MASKLESS EXPOSURE OF SUBSTRATE TO BE EXPOSED, AND PLOTTER AND PLOTTING METHOD FOR DIRECTLY PLOTTING ON OBJECT TO BE PLOTTED

BACKGROUND OF THE INVENTION

1. Field of the Invention

The present invention relates to an exposing apparatus and an exposing method, for maskless exposure of a substrate to be exposed, and a plotter and plotting method for directly plotting on an object to be plotted.

2. Description of the Related Art

In the manufacturing process of a wiring substrate, a resist film, that is, a photosensitive resin film, is formed on the substrate, the resist is exposed into a desired pattern, and the desired pattern is formed by etching processing. In recent years, however, a maskless exposing method, that is, a method for exposing without using a photomask has been proposed because the above-mentioned method uses a photomask and the cost is accordingly higher.

As an example of a maskless exposing method, Japanese Unexamined Patent Publication (Kokai) No. 10-112579 has disclosed a technique for exposing a resist formed on a substrate, in which pattern data in accordance with the pattern to be exposed is formed, the pattern data is input to a digital micro-mirror device (DMD), each of a plurality of infinitesimal mirrors is tilted in accordance with the pattern data, a ray of light is projected on the DMD and the resist is irradiated with reflected light from each infinitesimal mirror, and thus a desired exposure pattern, in accordance with the pattern data, is formed.

On the other hand, Japanese Unexamined Patent Publication No. 2001-174721 has disclosed a technique, for various plotters using a DMD, in which the DMD, made up of infinitesimal mirrors capable of tilting independently of each another, is arranged between a laser light source and a laser scanner and a laser beam is reflected on the DMD for plotting.

In the DMD, a plurality of infinitesimal mirrors are arranged at predetermined intervals. The light projected onto the DMD is reflected by the infinitesimal mirrors of the DMD and the substrate to be exposed is irradiated therewith. In the meantime, the substrate to be relatively exposed moves at a predetermined speed with respect to the infinitesimal mirrors, that is, the light source, and undergoes the exposing processing sequentially.

Figure 5:
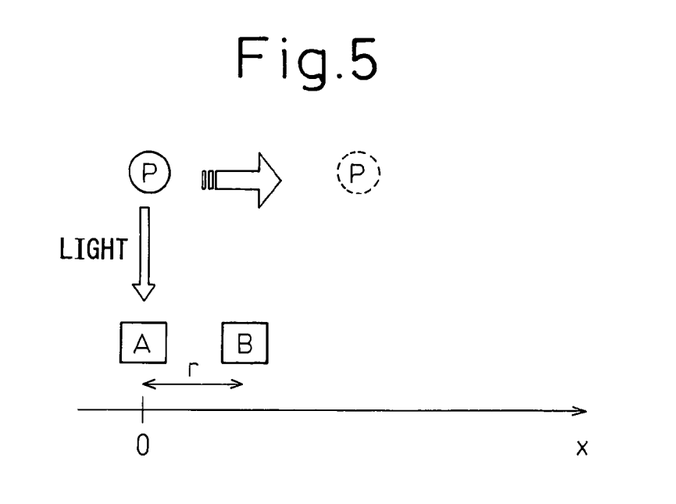
FIG. 5 is a diagram for explaining the positional relationship between the substrate to be exposed and the light source.

FIG. 5 is a diagram for explaining the positional relationship between the substrate to be exposed and the light source.

It is assumed that the number of times the turning-on and turning-off of the light source P can be switched per unit time is F. In the present specification, this F is referred to as a frame rate. It is also assumed that the relative distance covered by the movement of the substrate to be exposed with respect to the light source, during the period of time corresponding to one frame, that is, during the time required for determining whether the light source P is turned on or left in the unlit state at the next timing, is S. In the present specification, this S is referred to as a step size.

In FIG. 5, a case where spot A and spot B at a distance r from each other on the substrate to be exposed are discriminated and irradiated with the light from the light source P is explained as an example.

It is assumed that the spot A is exposed by the light source at a point of time when the substrate to be exposed moves in the positive direction of the x-axis. The coordinate of the spot A on the x-axis is assumed to be the origin O.

During the period of time required for determining whether the light source P is turned on or left in the unlit state at the next timing, that is, during the period of time corresponding to one frame, the substrate to be exposed travels the distance S with respect to the light source P. Therefore, if the spot B to be exposed after the spot A is apart from the spot A only by the distance r shorter than the distance S along the direction of the relative movement of the light source P, the light source P will pass beyond the spot B (the position of the light source P is denoted by the circle drawn by the dotted line) when the period of time corresponding to one frame elapses after the spot A is exposed, therefore, the spot B cannot be exposed. In other words, when the step size S is longer than the distance r between the neighboring spots to be exposed, that is, when r<S, a desired exposing process cannot be carried out. In other words, when the distance r between the neighboring spots to be exposed is beyond the ability to control the turning-on of the light source in an exposing system, the desired exposing process cannot be carried out. Hereinafter, the distance r between the neighboring spots is referred to as the resolution.

As described above, the finer the exposing pattern on the substrate to be exposed, the finer the resolution r needs to be.

By the way, when the distance r between the neighboring spots to be exposed is shorter than the interval of the light sources, conventionally, the substrate to be exposed is moved relatively with respect to the row of two or more light sources arranged in a two-dimensional pattern at an angle to the direction perpendicular to the direction of the relative movement with respect to the light source P on the substrate to be exposed.

In contrast to this, as to the direction of the relative movement with respect to the light source P on the substrate to be exposed, one possible solution is that the moving speed of the substrate to be exposed with respect to the light source P is reduced, that is, the step size S is reduced. However, if the step size S is reduced in order to carry out the exposing process with a fine resolution r, the exposing speed (throughput) is reduced. From the standpoint of the exposing speed and productivity, it is preferable that the step size S is as large as possible.

As described above, the fact that, on one hand, a fine resolution r is maintained and, on the other hand, the exposing speed is increased, that is, the step size S is increased contains two incompatible prepositions essentially. It seems that the demand in the industrial field for finer exposing patterns and for higher speeds of exposing process will become stronger in the near future. Therefore, a solution is expected for an exposure in which even when the distance (that is, resolution) r between neighboring spots is shorter than the step size S, in other words, even when r<S, a desired resolution r and step size S can be maintained.

The above-mentioned problem is not limited to the maskless exposing apparatus using the DMD, but significantly relates to a plotter such as an ink-jet plotter in which a plurality of ink-jet heads are arranged at predetermined intervals and which carry out the plotting process while an object to be plotted moves relatively with respect to the ink-jet heads.

Therefore, the object the present invention is, the above-mentioned problem being taken into account, to provide an exposing apparatus and an exposing method capable of efficiently irradiating with light even a row of spots having the distance between neighboring spots to be irradiated shorter than the distance covered by the relative movement of a substrate to be exposed during one period of the shortest turning-on controllable period of the light source, and to provide a plotter and a plotting method capable of efficiently plotting even a row of spots having a distance between neighboring spots, to be plotted, shorter than the distance covered by the relative movement of an object to be plotted during one period of the shortest head controllable period of the plotting head.

SUMMARY OF THE INVENTION

In order to realize the above-mentioned objects, in the exposing apparatus and in the exposing method according to the present invention, in which a desired exposing pattern is formed on a substrate to be exposed relatively moving with respect to a light source, desired spots on the substrate to be exposed relatively moving with respect to the light source are irradiated with the light only from specific light sources at a specific timing among a plurality of light sources arranged along the direction of the relative movement.

In other words, in the exposing apparatus and exposing method according to the present invention, even though the plurality of light sources are arranged along the direction of relative movement, all of the light sources are not necessarily used but a so called "thinning exposure" is carried out, that is, only several light sources are turned on at a specific timing to expose a substrate to be exposed in accordance with the circumstance.

According to the present invention, a row of spots having the interval shorter than the distance covered by the relative movement of the substrate to be exposed during one period of the shortest turning-on controllable period of the light source is irradiated by controlling the turning-on of only the specific light sources of the plurality of light sources at a specific timing. The principle of operation is explained below.

Figure 1:
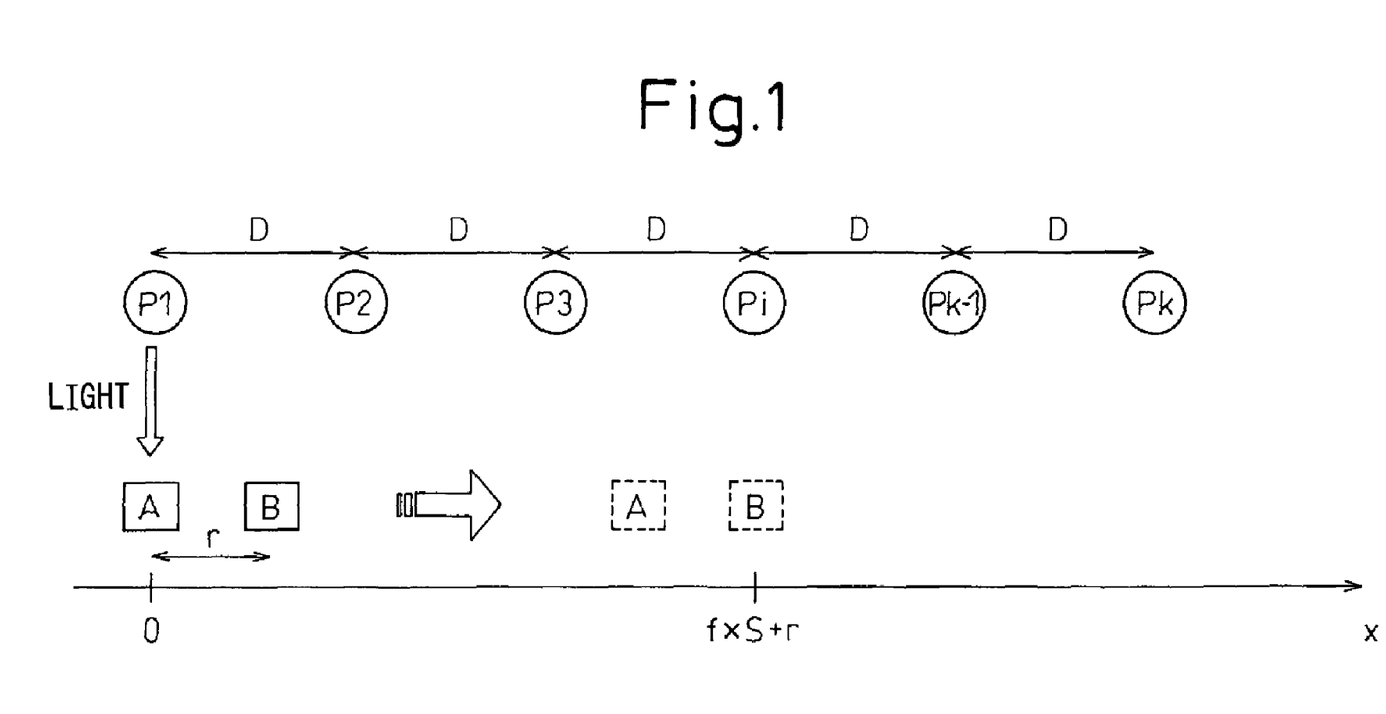
FIG. 1 is a diagram for explaining the principle of the exposing apparatus and the exposing method according to the present invention.

FIG. 1 is a diagram for explaining the principle of the exposing apparatus and the exposing method according to the present invention.

Here, a case where a spot A and a spot B at a distance r from each other on the substrate to be exposed relatively moving with respect to the light source at a speed covering the step size S during one frame, is explained.

In the exposing apparatus according to the present invention, k units of light sources are arranged on a line along the direction of the relative movement as shown in FIG. 1 and the identification numbers i=1, 2, ..., k are assigned to the light sources P. The distance between neighboring light sources is assumed to be D. In an exposing apparatus using the DMD, the infinitesimal mirrors correspond to these light sources Pi.

It is also assumed that the turning-on and turning-off of the k units of the light sources Pi can be switched F times per unit time independently of each another. In other words, the frame rate is assumed to be F. The number of F is denoted by f.

What should be focused on here is the fact that the distance r between neighboring spots is shorter than the step size S covered by the relative movement of the substrate to be exposed with respect to the light source during one period of the shortest turning-on controllable period of the light source, that is, during a period of time corresponding to one frame, that is, r<S.

When the substrate to be exposed moves in the positive direction of the x-axis, it is assumed that the spot A is exposed by the light source P at a point of time.

As the relative distance is S covered by the movement of the substrate to be exposed with respect to the light source P during a period of time corresponding to one frame that is, during the period of time required for determining whether the light source Pi is turned on or left in the unlit state at the next timing, after a period of time corresponding to the f frame is elapsed, the spot A travels f×S. Therefore, the x-coordinate of the spot B at a distance r from the spot A is obtained as f×S+r.

In order for the spot B to be irradiated, the spot B must be located directly under the light source Pi. This condition is expressed by the expression (1) as follows.

$$f \times S + r = (i-1) \times D \text{ (where, } 2 \leq i \leq k) \qquad (1)$$

As 0<r<S, by removing r from the left side of the expression (1), expression (2) is obtained as follows.

$$f \times S < (i-1) \times D \text{ (where, } 2 \leq i \leq k) \qquad (2)$$

By dividing both sides of expression (2) by S, expression (3) is obtained as follows.

$$0 < f < (i-1) \times D/S \text{ (where, } 2 \leq i \leq k) \qquad (3)$$

Expression (3) gives the upper limit of the number of frames capable of contributing to the irradiation of the spot B by the light source Pi.

In other words, if a specific light source Pi (where, $2 \leq i \leq k$) satisfies expression (1) for an arbitrary f which satisfies expression (3), it is possible to irradiate the substrate to be exposed with light at the spot B, which relatively moves at a speed covering the step size S per unit time under the k units of light sources arranged at intervals D, if the specific light source Pi is turned on in the f-th frame.

When there exist two or more specific light sources Pi which make f satisfying expressions (1) and (3) exist, it is possible to irradiate the spot B, with light, two or more times if these specific light sources Pi are turned on respectively in the corresponding f-th frame. Therefore it is easy to maximize the amount of light energy with which one point on the substrate to be exposed is irradiated. Or, when the amount of light energy required for exposure is fixed, the power of light source (or the cost required for turning on the light source) can be reduced.

According to the consideration above, in the present invention, i and f which satisfy expression (1) and (3) are calculated for the substrate to be exposed which relatively moves at a speed covering the step size S per unit time under k units of light sources arranged at intervals D, and the timing of the turning-on is controlled so that the i-th light source Pi is turned on in the corresponding f-th frame. Due to this, it is possible to irradiate a row of spots with light, the interval of which is shorter than the distance (that is, the resolution) covered by the relative movement of the substitute to be exposed during one period of the shortest turning-on controllable period of the light source.

When there exist two or more sets of i and f which satisfy expressions (1) and (3), these light sources Pi are turned on respectively in the corresponding f-th frame. Instead of controlling all of the light source Pi which satisfy expressions (1) and (3), it may be possible to control the turning-on only for selected light sources, if occasion arises.

Even though the step size S is a constant, in other words, a relative speed with respect to the light source of the substrate to be exposed, it can be a variable, instead of taking a fixed value which changes within a range that does not cause a problem in an actual use. In other words, it is possible to make it a variable, within a predetermined range, the relative speed with respect to the light source of the substrate to be exposed. For example, it is possible to reduce the relative speed with respect to the light source of the substrate to be exposed to a value less than the originally set value, in the expectation of some reduction in the exposing speed compared to the target value.

The parameter D is defined as the interval between neighboring light sources, but it appears as the interval between spots which may be produced on the substrate to be exposed when the substrate is irradiated with light. In the present specification, the parameter D is defined as the "spot interval" which indicates the interval between spots which may be produced when the surface of the substrate to be exposed is irradiated with the light emitted from the two or more light sources arranged at predetermined intervals along the direction of the relative movement. If a magnifying or reducing lens system is provided between the light source and the substrate to be exposed, it is possible to effectively make the value of D a variable, within a predetermined range, the spot interval D which may be produced on the substrate to be exposed when the substrate is irradiated with light. In other words, it is possible to make the parameter D also variable, in a predetermined range.

As described above, when there exists no i nor f which satisfies expressions (1) and (3), two or more values are set after setting at least one of the step size S and the spot interval D as a variable in a predetermined range. By the use of these two or more values, the sets of i and f which satisfy expressions (1) and (3) are calculated and the turning-on of the light source is controlled based on the calculation result.

In this case, as to which one of the step size S and the spot interval D is set as a variable or as to whether both are set as variables, it is possible to properly determine with various factors such as the contents of design and cost and time required for a manufacturing being taken into consideration. It is preferable that the step size S is set first as a variable and if a desired result cannot be obtained from this setting, then the spot interval D is also set as a variable.

The exposing apparatus and the exposing method are described as above, but the same principle can be applied to a plotter such as an ink-jet plotter, in which two or more ink-jet heads are arranged at predetermined intervals and the plotting process is carried out while an object to be plotted relatively moves with respect to the ink-jet heads.

According to the present invention, it is possible to irradiate a row of spots with the light emitted from the light sources, of which the interval between neighboring spots is shorter than the distance covered by the relative movement of the substrate to be exposed during one period of the shortest turning-on controllable period of the light source, while maintaining a desired resolution and relative speed of the substrate to be exposed with respect to the light sources. If the present invention is applied to a plotter such as an ink-jet plotter, the same effect can be obtained.

BRIEF DESCRIPTION OF THE DRAWINGS

The present invention will be more clearly understood from the description as set below with reference to the accompanying drawings, where in.

DESCRIPTION OF THE PREFERRED EMBODIMENTS

First, the exposing apparatus and the exposing method in the first embodiment of the present invention are explained blow.

Figure 2:
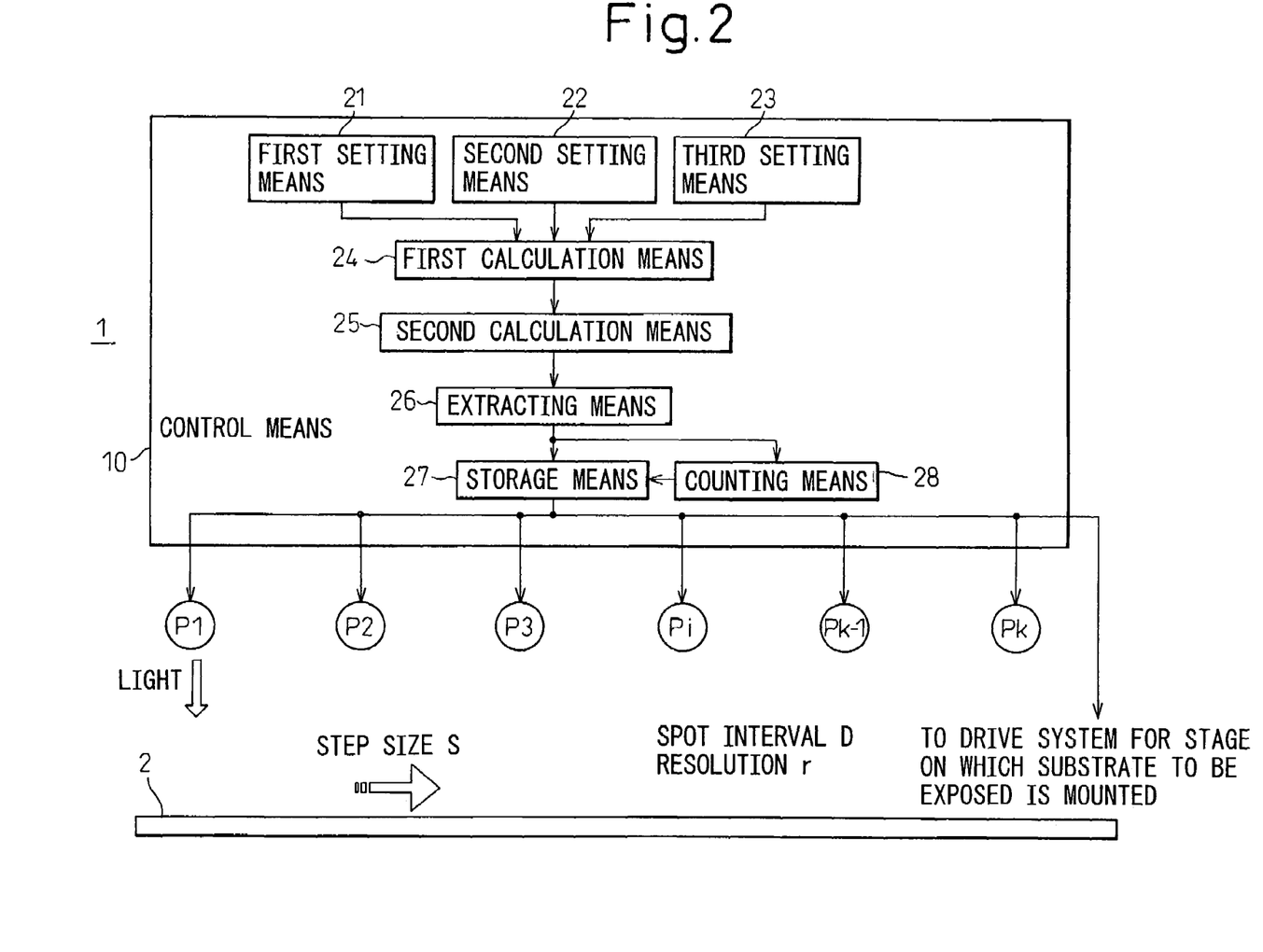
FIG. 2 is a functional block diagram showing an exposing apparatus in a first embodiment of the present invention.

FIG. 2 is a functional block diagram showing the exposing apparatus in the first embodiment of the present invention.

In an exposing apparatus 1 in the first embodiment of the present invention, k units of light sources are arranged side by side on a line in the direction of the relative movement. Identification numbers i=1, 2, . . . , k are assigned to the light sources P. In an exposing apparatus using the DMD, the infinitesimal mirrors correspond to these light sources Pi. In this case, light is projected on the DMD, the reflected light from each infinitesimal mirror is selected adequately in accordance with pattern data and the resist is irradiated therewith and exposed into a shape in accordance with the pattern data.

It is assumed that the turning-on and turning-off of the k units of the light sources Pi can be carried out for each of the light source Pi independently of each another and can be switched F times per unit time. In other words, F means the frame rate. By the way, the frame number is denoted by f.

The exposing apparatus 1 comprises a control means 10 for turning on only the specific light sources of the k units of the light sources Pi at a specific timing so that a row of spots is irradiated with light, the interval r of which is shorter than the distance S covered by the relative movement of a substrate to be exposed 2 during one period of the shortest turning-on controllable period of the light sources Pi, that is, during a period of time corresponding to one frame.

The control means 10 comprises a first setting means 21, a second setting means 22, a third setting means 23, a first calculation means 24, a second calculation means 25, an extracting means 26, a storage means 27 and a counting means 28. The control mean 10 can be realized by, for example, a control IC, arithmetic processing unit, memory and various types of software programs to be provided within the exposing apparatus.

The first setting means 21 sets the interval between neighboring target spots in a row of target spots to be irradiated with light on the substrate to be exposed 2 as the target relation r0. The position of the target spot to be irradiated with light is defined by the design data to be input to the exposing apparatus 1.

The second setting means 22 sets the distance covered by the relative movement of the substrate to be exposed 2 during one period of the shortest turning-on controllable period of the light source Pi, that is, a period of time corresponding to one frame, as the step size S.

The third setting means 23 sets the interval of spots, which may be produced when the substrate to be exposed 2 is irradiated with the light emitted from the k units of light sources Pi arranged on a line along the direction of the relative movement, as the spot interval D.

The first calculation means 24 calculates all of the frame numbers f which satisfy $$0 < f < (i-1) \times D/S \text{ (where, } 2 \leq i \leq k \text{)} \quad (4)$$

where the identification numbers of the k units of light sources Pi arranged on a line are denoted by i=1, 2, . . . , k, respectively, the number of times the turning-on and turning-off of a specific light source can be switched per unit time is denoted by the frame rate F, and the number of the present frame is f (F and f are integers).

The distance r between neighboring spots is shorter than the step size S, that is, r<S.

The second calculation means 25 calculates all of the resolution candidates r obtained from $$r=(i-1)\times D - f\times S \text{(where, } 2\leq i \leq k) \quad (5)$$

for all of the sets of the frame number f calculated by the first calculation means 24, the step size S and the spot interval D.

The extracting means 26 extracts the resolution candidates r within the allowable range of the target resolution r0.

The storage means 27 stores each piece of data of the identification number i of the light source Pi, the frame number f, the step size S and the spot interval D in accordance with the resolution candidates r within the allowable range of the target resolution r0 extracted by the extracting means 26.

The counting means 28 counts the number of the resolution candidates r within the allowable range of the target resolution r0 extracted by the extracting means 26. The result of the count is stored by storage means 27.

The control means 10 turns on the light source in accordance with the identification number i stored by the storage means 27 in the f-th frame in accordance with the identification number i, for the substrate to be exposed relatively moving at a speed covering the step size S per unit time under the k units of light sources having the intervals D. Due to this, it is possible to irradiate a row of spots with light, the interval of which is shorter than the distance covered by the relative movement of the substrate to be exposed during one period of the shortest turning-on controllable period of the light sources.

If the storage means 27 stores two or more sets of the identification number i of the light source Pi, the frame number f, the step size S and the spot interval D in accordance with the resolution candidates r within the allowable range of the target resolution r0 extracted by the extracting means 26, these specific light source Pi are turned on respectively in the corresponding f-th frame. At this time, it may be possible, if necessary, to control turning-on of only further selected light sources instead of controlling all of the light sources Pi, as described above.

When the storage means 27 stores no set of the identification number i of the light source Pi, the f-th frame, the step size S and the spot interval D, or when the number of sets is smaller than a desired number (this result is counted by the counting means 28), in other words, when there exist no i nor f which satisfy expressions (4) and (5), or when the number of sets is smaller than a desired number, at least one of the step size S set by the second setting means 22 and the spot interval D set by the third setting means 23 is set as a variable having a predetermined variable range. The turning-on control of the light sources is carried out based on the result calculated using each parameter set in this way.

When the spot interval D set by the third setting means 23 is set as a variable in a predetermined range, it is preferable to provide a magnifying or reducing lens system (not shown) between the light sources Pi actually set and the substrate to be exposed. By means of the a magnifying or reducing lens system, the path of the light emitted from the light sources Pi is adjusted so that the substrate to be exposed 2 is irradiated at the intervals of the spot interval D with the light emitted from the light sources Pi.

When the step size S set by the second setting means 22 is set as a variable in a predetermined range, the control means 10 controls the drive system (not shown) of a stage for mounting the substrate to be exposed so that the substrate to be exposed 2 moves relatively with respect to the light sources Pi at a speed covering the step size S per time unit.

In this case, as to which one of the step size S and the spot interval D is set as a variable or as to whether both are set as variables, it is possible to properly determine with various factors such as the contents of design and cost and time required for manufacturing being taken into consideration. For example, it is preferable that the step size S is set first as a variable and if a desired result cannot be obtained from this setting, then the spot interval D is also set as a variable.

Figure 3:
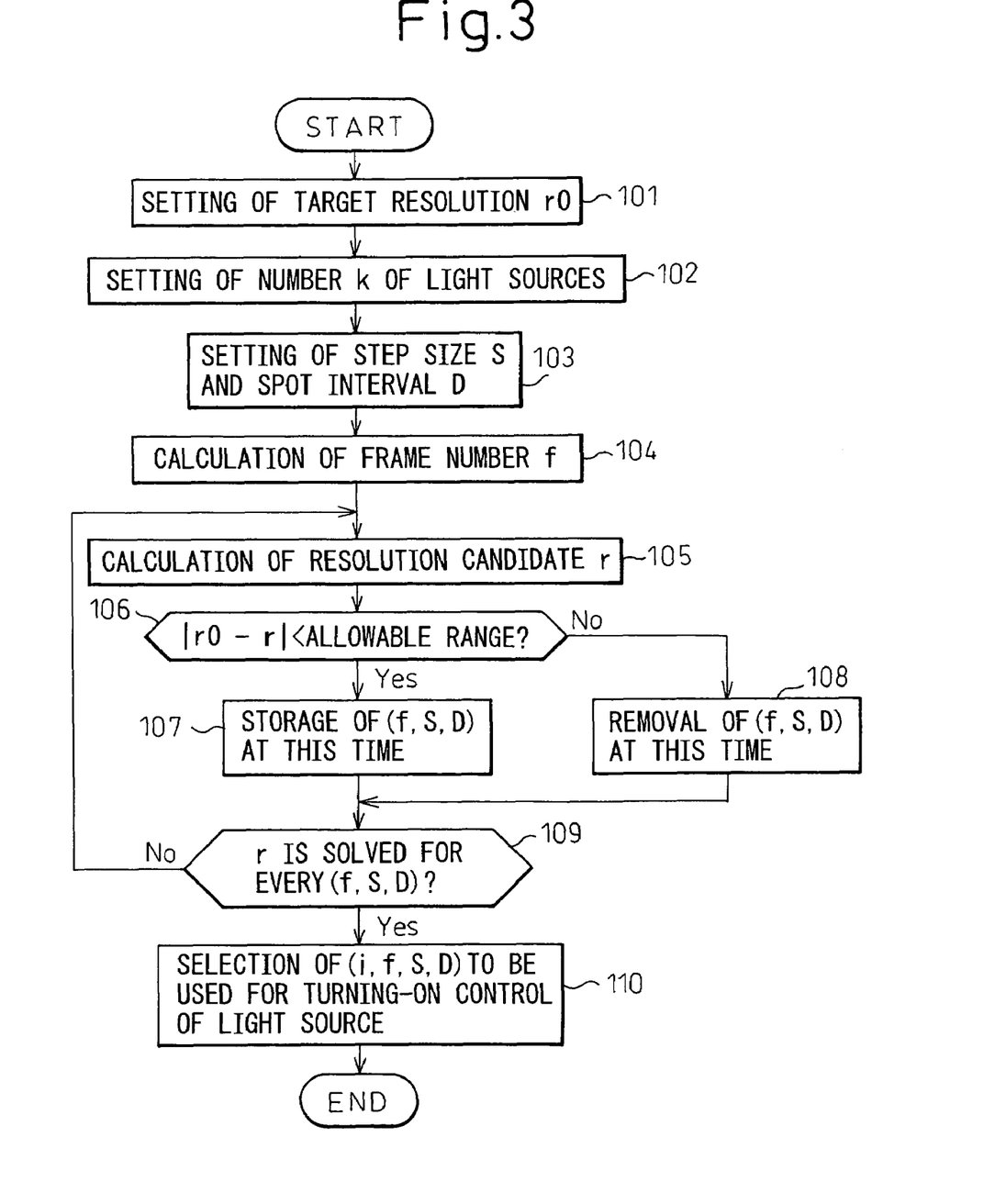
FIG. 3 is a flow chart showing the operation flow of the exposing method in the first embodiment of the present invention.

FIG. 3 is a flow chart showing the operation flow of the exposing method in the first embodiment of the present invention.

Here, the operation flow in the case where both the step size S set by the second setting means 22 shown in FIG. 2 and the spot interval D set by third setting means 23 are set as variables in predetermined ranges is explained below.

First, in step 101, the distance between neighboring target spots of a row of target spots on the substrate to be exposed 2 to be irradiated with light is set as the target resolution r0.

Then, in step 102, the number k of light sources is set. The number of light sources should be set in advance with various factors such as the design contents of the apparatus, the manufacturing cost and the running cost of the apparatus being taken into account. If the number k of light sources can be derived by calculation based on the relationship with the target resolution r0, the value of k can be used.

Next, in step 103, the step size S and its variable range are set. At the same time, in step 103, the spot interval D and its variable range are also set. The step size S and the spot interval D are to be used in the arithmetic process in a later stage as two or more values having a predetermined "separation" within the variable range set in step 103.

Next, in step 104, all of the frame numbers f which satisfy expression (4) are calculated for every set (of S and D) obtained in step 103 described above. Here, the fact that the frame number f is a whole member should be noted. In this step 104, two or more sets of (f, S, D) are obtained.

Next, in step 105, all of the resolution candidates r which satisfy expression (5) are calculated for one of the sets (f, S, D) obtained in step 104.

Next, in step 106, whether the resolution candidate r coincides with the target resolution r0 set in step 101 or falls within the allowable range, that is, whether |r0−r|<allowable range holds is judged for all of the resolution candidates r obtained in step 105. If there exists a solution, the set of (f, S, D) in question is stored in step 107. If there exists no solution, the set of (f, S, D) in question is removed in step 108. By the way, the "number k' of solutions r" for a certain set of the step size S and the spot distance D is a number of the light sources to be turned on out of the k units of light sources, therefore, indicating the amount of light energy of the irradiation.

Here, the reason why the allowable range is provided in step 106, in addition to the condition that the resolution candidate r perfectly coincides with the target resolution r0, is explained below.

Both sides of expression (1) have a form of "positive integer×real number" and it is extremely rare that the result of the operation "real number÷ real number" coincides with a specific real number (r0). On the other hand, the substrate to be exposed is conveyed on a stage moving smoothly. However, the movement of the stage can be discretized with a positional or mechanical resolution of the stage. Therefore, if the difference between an obtained resolution candidate r and the target resolution r0 falls within the range of the mechanical resolution, these points are regarded as the same point. For example, when the target resolution r0=0.5 µm and the resolution of the stage is 0.1 µm (20% of the target resolution), values such as r=0.5489, 0.5438 and 0.5388 µm are finally rounded off to 0.5 µm because of the mechanical resolution of the stage. For of these reasons, the allowable range is provided for the judging process carried out in step 106.

In step 109, whether the processes in steps 105 to 108 have been carried out for all of the sets of (f, S, D) obtained in step 104, that is, whether the solution r has been obtained for all of the sets of (f, S, D) by the use of expressions (4) and (5), is judged.

After the arithmetic processes described above are completed for all of the sets of (f, S, D), the set of (i, f, S, D) to be used for the turning-on control of the light source is selected in step 110.

By the use of the set of (i, f, S, D) selected in step 110, the drive system of the stage for mounting the substrate to be exposed 2 is controlled so that the substrate to be exposed 2 relatively moves with respect to the light source at a speed covering the step size S per unit time. On the other hand, a magnifying or reducing lens system is arranged between the actually set light sources Pi and the substrate to be exposed 2 and the path of the light emitted from the actually set light sources Pi is adjusted so that the substrate to be exposed 2 is irradiated at the spot intervals D with the light emitted from the actually set light sources Pi. Then the timing for turning-on is controlled so that the light source Pi with identification number i is turned on in the f-th frame.

A determination may be made properly as to which set of (i, f, S, D) should be selected, with the various factors such as the design contents and the cost and time required for manufacture being taken into consideration. For example, a set is selected according to the priority decided based on the design of an exposing apparatus. As an example, the priority is decided in such a way that the first priority is given to a set which maximizes the number k' of light sources to be turned on, (this means a set which maximizes the amount of light energy for irradiation), the second priority is given to a set which has a larger step size S when k' is the same (this means a faster exposing speed), and the third priority is given to a set which has a smaller spot interval D (this means a firer spot interval and a smaller size of the spot itself), then the set of (i, f, S, D) to be used for the control of turning-on of the light sources is selected. It may be of course possible to use all of the obtained sets of (i, f, S, D) for control.

Next, an example of computer simulation using actual values in the first embodiment of the present invention is shown below.

In the simulation, it is assumed that the target resolution r0 is 0.5 µm, the allowable range of the target resolution is ±10%, the throughput corresponding to the target step size S is 30 seconds, its allowable range is ±20%, the number k of light sources is 24, and the interval of the actually arranged light sources is 437.97 µm.

The priority, according which the set of (i, f, S, D) is selected for the control of turning-on of the light sources, is decided in such a way that the first priority is given to a set which maximizes the number k' of light sources to be turned on, the second priority is given to a set which has a larger step size S, and the third priority is given to a set which has a smaller spot interval D.

Figure 4:
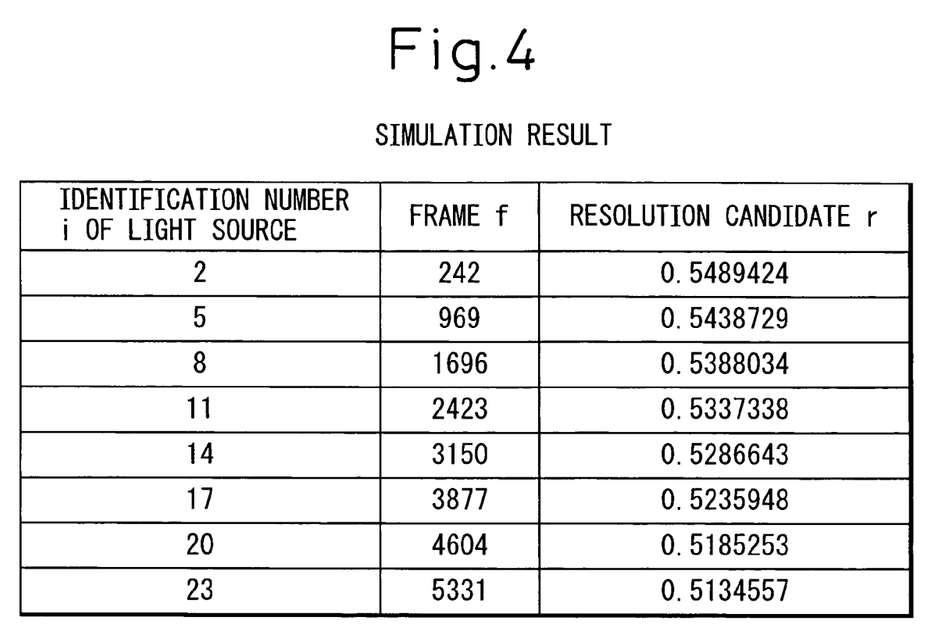
FIG. 4 is a diagram showing an example of the computer simulation result in the first embodiment of present invention.

FIG. 4 is a diagram showing the result of the computer simulation in the first embodiment of the present invention.

Through this simulation, it was found that there existed eight solutions r. In other words, k'=8. It was found at the same time through the simulation that they were also the solutions in the case where the step size S was set to 93.2% of the target value (that is, the throughput was somewhat reduced) and the spot interval D was realized by the use of a reducing lens system with a reduction ratio of 91.4%.

In FIG. 4, the first solution, for example, means that if control is taken so that when a spot A is exposed by the light source P1 with identification number 1 in the 0-th frame, the light source P2 with identification number 2 is turned on in the two hundred forty-second frame, a spot B at a distance of 0.5489 µm from the spot A is exposed. As described above, a value of 0.5489 µm is equivalent to 0.5 µm because the value is rounded off to a value of integer multiples of 0.1 µm because of the resolution of the stage.

As described above, according to the first embodiment of the present invention, it is possible to irradiate with light from the light source a row of spots, the interval of which is shorter than the distance covered by the relative movement of the substrate to be exposed during one period of the shortest turning-on controllable period of the light sources, while maintaining a desired resolution and relative speed of the substrate to be exposed with respect to the light sources.

The exposing apparatus and the exposing method in the first embodiment of the present invention are described as above, and the quite the same principle can be applied to a plotter in which two or more plotting heads are arranged at predetermined intervals and which carries out the plotting process while an object to be plotted relatively moves with respect to the plotting heads. An example of such a plotter is an ink-jet plotter. The ink-jet plotter is explained below as the second embodiment of the present invention.

In recent years, the ink-jet plotter in which two or more ink-jet heads are arranged at predetermined intervals and which carries out the plotting process while an object to be plotted relatively moves with respect to the ink-jet heads is regarded as a promising means for plotting (patterning) patterns directly on a substrate.

The ink-jet technique is one for discharging liquid drops through a nozzle having a small hole. Generally the ink-jet technique is used frequently in a printer, but when the technique is applied to ink-jet patterning as in the present invention, it is recommended that liquid containing fine metallic particles or liquid made of metal oxide material is used as the liquid drops discharged from the nozzle. The ink-jet technique is classified into a piezo type in which piezo-electric elements, which are deformed when a voltage is applied, are used and liquid drops are pushed out through the nozzle by increasing liquid pressure in an ink chamber instantaneously and a thermal type in which bubbles generated within liquid by a heater attached to a header and are pushed out, but the present embodiment can be applied to both types.

The present embodiment is one in which the exposing heads, that is, the light sources, in the first embodiment of the present invention, described above, are replaced with the ink-jet heads.

In other words, the plotter, for plotting and forming a desired plotting pattern directly on a desired spot on an object to be plotted relatively moving with respect to the ink-jet heads by the use of two or more ink-jet heads arranged side by side along the direction of the relative movement, comprises a control means for controlling the two or more ink-jet heads so that only specific ink-jet heads thereof are put into plotting operation with a specific timing. In other words, the control means puts into plotting operation only the specific ink-jet heads out of the two or more ink-jet heads with a specific timing so that a row of spots is directly plotted, the interval of which is shorter than the distance covered by the relative movement of the object to be plotted during one period of the shortest plotting operation controllable period of the ink-jet heads.

The arrangement of the ink-jet heads is the same as that of the exposing heads of the maskless exposing means explained by referring to FIG. 1, therefore, the principle of operation is the same as in the first embodiment. When the ink-jet heads are arranged at predetermined intervals and the interval is shorter than the interval of the spots to be plotted, if the principle of operation of the first exposing apparatus already explained is applied to the ink-jet plotter, it is possible to directly plot on an object to be plotted while maintaining a desired resolution and relative speed of the object to be plotted with respect to the ink-jet heads.

As described above, according to the exposing apparatus and the exposing method in the first embodiment of the present invention, it is possible to irradiate a row of spots with light from the light sources, the interval of which is shorter than the distance covered by the relative movement of the substrate to be exposed during one period of the shortest turning-on controllable period of the light sources while maintaining a desired resolution and relative speed of the substrate to be exposed with respect to the light sources.

On the other hand, according to the plotter and the plotting method in the second embodiment of the present invention, it is possible to directly plot, by the use of plotting heads, on a row of spots, the interval of which is shorter than the distance covered by the relative movement of the object to be plotted during one period of the shortest plotting operation controllable period of the plotting heads such as ink-jet heads while maintaining a desired resolution and relative speed of the object to be plotted with respect to the plotting heads.

What is claimed is:

1. An exposing method for irradiating desired spots on a substrate to be exposed relatively moving with respect to two or more light sources arranged along the direction of the relative movement to form a desired exposure pattern using the light sources, wherein a control step is included for controlling the turning-on of only specific light sources out of the two or more light sources at a specific timing, thereby a row of spots is irradiated with light, the interval of which is shorter than the distance covered by the relative movement of the substrate to be exposed during one period of the shortest turning-on controllable period of the light sources.

2. An exposing method, as set forth in claim 1, wherein the control step comprises: a first setting step for setting the interval between neighboring target spots in a row of target spots to be irradiated with light on the substrate to be exposed as a target resolution $r0$; a second setting step for setting the distance covered by the relative movement of the substrate to be exposed during one period of the shortest turning-on controllable period of the light sources as a step size $S$; a third setting step for setting the interval of spots, which may be produced when the substrate to be exposed is irradiated with the light emitted from the two or more light sources arranged along the direction of the relative movement, as a spot interval $D$; a first calculation step for calculating all of the frame numbers $f$ which satisfy $$0 < f < (i-1) \times D/S \text{(where, } 2 \leq i \leq k\text{)}$$

where the identification numbers of $k$ units of light sources arranged along the direction of the relative movement are denoted by $i=1, 2, \ldots, k$, respectively, the number of times the turning-on and turning-off of a specific light source can be switched per unit time is denoted by a frame rate $F$, and the frame number at this time is denoted by $f$ ($F$ and $f$ are integers); a second calculation step for calculating all of the resolution candidates $r$ obtained from $$r = (i-1) \times D - f \times S \text{(where, } 2 \leq i \leq k\text{)}$$

for all of the sets of the frame number $f$, the step size $S$ and the spot interval $D$; and an extracting step for extracting the resolution candidates $r$ within the allowable range of the target resolution $r0$.

3. An exposing method, as set forth in claim 2, wherein at least one of the step size $S$ set by the second setting step and the spot interval $D$ set by the third setting step is set as a variable within a predetermined range.

4. An exposing method, as set forth in claim 3, further comprising an arranging step for arranging a magnifying or reducing lens system between the actually set light sources and the substrate to be exposed so that the substrate to be exposed is irradiated with the light emitted from the actually set light sources at intervals of the spot interval $D$ when two or more spot intervals $D$ are set by the third setting step within the predetermined range.

5. An exposing method, as set forth in step 3, wherein the control step controls so that the substrate to be exposed moves relatively with respect to the light sources at a speed covering the step size $S$ per unit time when two or more step sizes $S$ are set by the second setting step within the predetermined range.

6. An exposing method, as set forth in claim 2, wherein the control step further comprises a storage step for storing the identification number $i$ and the frame number $f$ in accordance with the resolution candidate $r$ within the allowable range of the target resolution $r0$ extracted by the extracting step.

7. An exposing method, as set forth in claim 6, wherein the storage step further stores at least one of the step size $S$ and the spot interval $D$ in accordance with the resolution candidate $r$ within the allowable range of the target resolution $r0$ extracted by the extracting step.

8. An exposing method, as set forth in claim 6, wherein the control step turns on the light source in accordance with the identification number $i$ stored by the storage step at a timing of the frame number $f$ in accordance with the identification number $i$.

9. An exposing method, as set forth in claim 2, wherein the control step further comprises a counting step for counting the number of resolution candidates $r$ within the allowable range of the target resolution $r0$ extracted by the extracting step.

* * * * *